United States Patent [19]

Chen et al.

[11] Patent Number: 5,359,170
[45] Date of Patent: Oct. 25, 1994

[54] APPARATUS FOR BONDING EXTERNAL LEADS OF AN INTEGRATED CIRCUIT

[75] Inventors: Sy-Hwa Chen; Johnston W. Peeples, both of Columbia; Terry Craps, Lexington, all of S.C.

[73] Assignee: AT&T Global Information Solutions Company, Dayton, Ohio

[21] Appl. No.: 838,637

[22] Filed: Feb. 18, 1992

[51] Int. Cl.⁵ ............................................. B23K 3/047
[52] U.S. Cl. ............................. 219/85.18; 219/85.16; 228/44.7
[58] Field of Search .................. 219/85.16, 85.18, 228, 219/229, 230, 233; 228/51, 20, 52, 53, 54, 122, 44.7, 180.2, 9, 180.21, 20.5; 427/314, 318

[56] References Cited

U.S. PATENT DOCUMENTS

| | | | |
|---|---|---|---|
| 2,501,616 | 3/1950 | Robinson | 428/469 |
| 3,393,855 | 7/1968 | Moser | 228/44 |
| 3,786,228 | 1/1974 | Castellana et al. | 219/233 |
| 3,813,023 | 5/1974 | Auray et al. | 228/19 |
| 4,826,068 | 5/1989 | Yagoura et al. | 228/44.7 |
| 4,830,260 | 5/1989 | Kent | 228/54 |
| 4,859,490 | 8/1989 | Ikegaya et al. | 427/318 |
| 4,871,899 | 10/1989 | DuFrenne | 219/85.16 |
| 4,932,582 | 6/1990 | Une | 228/122 |
| 5,048,180 | 9/1991 | Tanaka | 228/51 |
| 5,094,381 | 3/1992 | Amos et al. | 219/85.18 |
| 5,098,008 | 3/1992 | Viza et al. | 228/180.2 |
| 5,186,973 | 2/1993 | Garg et al. | 427/314 |
| 5,197,651 | 3/1993 | Nakamura et al. | 228/44.7 |
| 5,200,231 | 4/1993 | Bachman et al. | 427/314 |
| 5,213,248 | 5/1993 | Horton et al. | 228/44.7 |

FOREIGN PATENT DOCUMENTS

| | | | |
|---|---|---|---|
| 0032437 | 7/1981 | European Pat. Off. | 228/54 |
| 1-113172 | 5/1989 | Japan | 219/228 |
| 1-178365 | 7/1989 | Japan | 228/9 |
| 1-186269 | 7/1989 | Japan | 219/233 |
| 2-224349 | 9/1990 | Japan | |
| 3-33095 | 2/1991 | Japan | |
| 3-198360 | 8/1991 | Japan | 228/54 |
| 3-261671 | 11/1991 | Japan | |

OTHER PUBLICATIONS

"Diamond-Tipped and Other New Thermodes for Device Bonding", *IEEE Transactions on Components, Hybrids, and Manufacturing Technology,* vol. CHMT-2, No. 3, Sep. 1979, pp. 283–288.

"Boron-Nitride Coated Thermode Blade for Surface-Mounted Technology Interconnections", vol. 31, No. 3, Aug. 1988, pp. 98–99.

*Primary Examiner*—Geoffrey S. Evans
*Attorney, Agent, or Firm*—Paul W. Martin; Jack R. Penrod

[57] ABSTRACT

A hot bar apparatus for effecting solder bonds for high density electronic components has a diamond or diamond-like (i.e. a generally diamond crystal lattice with graphite impurities) surface that makes contact with the leads of the electronic component and transmits the heat necessary to effect a solder bond. The diamond or diamond-like surface has superior wear characteristics over any other material, and it also is an electrical insulator to protect the electronic components from spurious voltages and currents generated by electrical currents that provide the heat for the hot bar.

3 Claims, 3 Drawing Sheets

APPARATUS FOR BONDING EXTERNAL LEADS OF AN INTEGRATED CIRCUIT

BACKGROUND OF THE INVENTION

The present invention relates to methods and apparatus for bonding leads of an electrical device, and more particularly to a method and apparatus for bonding external leads of an integrated circuit or similar device to effect electrical and physical connections.

A commonly known type of physically and electrically bonding an electrical or electronic component to an electrical circuit is referred to as soldering. In soldering, a molten metal, such as a tin-lead alloy, is applied to a junction between a component and the circuit it is to be bonded to. When the molten metal at this junction solidifies by cooling, the component is fused and bonded to the circuit.

There are numerous methods of melting and applying the solder to the component. One method is to prepare a bath of molten solder and then dip the leads to be soldered into this bath. A special version of this method is called wave soldering and is used on through-hole printed circuit boards. This is an excellent method, but it is limited to the soldering of larger components with significant lead-to-lead separation. Unfortunately for the more modern high density components, e.g. lead pitches of 0.020 inches, solder bath techniques not only solder the component lead to the desired conductor, but also bridge over to make undesired connections with adjacent leads and adjacent conductors.

Another method is to apply heat by means of a soldering iron to the junction of a component lead, its connection conductor and some solid solder in order to melt the solder and form the desired bond. One such soldering iron is described in U.S. Pat. No. 2,501,616 entitled Soldering Iron Tip and issued to P. Robinson. This patent explains that some of the usual problems of a soldering iron are that the soldering surface degrades and changes character-istics with use, with the result being poor and inconsistent solder bonds.

An updated version of the soldering iron is called a hot bar. A hot bar may have various geometries in order to solder all leads on at least one side at once. Some hot bar machines solder all leads of an integrated circuit in one operation. The hot bar is precisely placed over the leads of an integrated circuit and then lowered into contact with all of the leads at once. The temperature and amount of heat transferred to the leads are carefully controlled to obtain consistent results.

Unfortunately, the electrical currents that are passed through each hot bar thermode to raise the temperature to the proper level induces a local electric field of a level that can be damaging to integrated circuitry.

The surface of the hot bar, like the soldering iron, also degrades and changes with use. The soldering surface of the hot bar becomes scratched, distorted and worn with use. Distortions and wear are especially troublesome because even and consistent physical contact is necessary for consistent solder bonds. Further, flux residues and dirt will adhere and build up on scratches of the hot bar. This build up not only causes inconsistent heating, but the dirt and scratches also interact with the solder to cause solder bridges to form between the integrated circuit leads, or solder to adhere to both the integrated circuit lead and the hot bar during a cool down cycle, thereby causing a tearing of the solder.

It is an object of the present invention to provide a hot bar soldering surface that is immune to scratches and wear.

It is another object of the present invention to provide a hot bar soldering surface that does not appreciably change its heat transfer characteristics with use.

It is another object of the present invention to provide a hot bar soldering surface that has a high thermal conductance and a low electrical conductance.

SUMMARY OF THE INVENTION

Briefly stated, in accordance with one aspect of the invention the foregoing objects are achieved by providing a hot bar that has a soldering surface made of elemental carbon which is in a crystalline form that is generally cubic, for example diamond and diamond-like materials, the latter having graphite impurities in the crystal lattice.

In accordance with another aspect of the invention, the foregoing objects are achieved by providing a soldering device. The soldering device includes a bar made of a refractory metal. The bar of refractory metal has a layer of elemental carbon of a cubic crystalline form, such as diamond or diamond-like materials, covering it.

In accordance with a another aspect of the invention the foregoing objects are achieved by providing an apparatus for soldering each external lead of an integrated circuit to a respective conductor. The apparatus includes a thermode for converting an electrical current into heat to effect the temperature of the thermode. A temperature sensor senses the temperature of the thermode and communicates a signal to a control unit that the temperature sensor is connected to. The control unit limits the flow of electrical current according to the signal from the temperature sensor in order to control the temperature of the thermode to predetermined levels. The thermode has a coating of diamond or diamond-like material covering a portion thereof to provide a durable layer that heat is transferred through in order to solder bond each external lead to its respective conductor.

In accordance with another aspect of the invention, the foregoing objects are achieved by providing a method of bonding an exterior lead of an electrical device to a conductor. The method includes the steps of locating the exterior lead of the electrical device in physical contact with the conductor, locating a diamond covered surface in physical contact with the exterior lead of the electrical device, transferring heat through the diamond covered surface in the presence of a quantity of solder to cause the solder to melt and flow onto the exterior lead of the electrical device and the conductor, and reducing the heat transferred through the diamond surface allowing the solder to solidify and form a bond between the exterior lead and the conductor.

In accordance with another aspect of the invention, the foregoing objects are achieved by providing a method of bonding an exterior lead of an electrical device that has a quantity of solder deposited thereon to a conductor. The method includes the steps of locating the exterior lead of the electrical device in physical contact with the conductor, locating a diamond covered surface in physical contact with the exterior lead of the electrical device, transferring heat through the diamond covered surface to melt the quantity of solder to cause the solder to melt and flow onto the exterior lead of the electrical device and the conductor, and reducing the heat transferred through the diamond surface allowing the solder to solidify and form a bond between the exterior lead and the conductor.

In accordance with another aspect of the invention, there is provided a method for manufacturing a soldering device. The method of manufacture includes the steps of covering a bar with a layer of elemental carbon of a cubic crystalline form of diamond or diamond-like materials and attaching the bar to a body of the soldering device such that the layer of elemental carbon of a cubic crystalline form is the soldering surface for the soldering device.

BRIEF DESCRIPTION OF THE DRAWINGS

While the specification concludes with the appended claims particularly pointing out and distinctly claiming the subject matter which is regarded as the invention, it is believed that the invention will be better understood from the following description taken in conjunction with the accompanying drawings in which:

DETAILED DESCRIPTION

Figure 1:
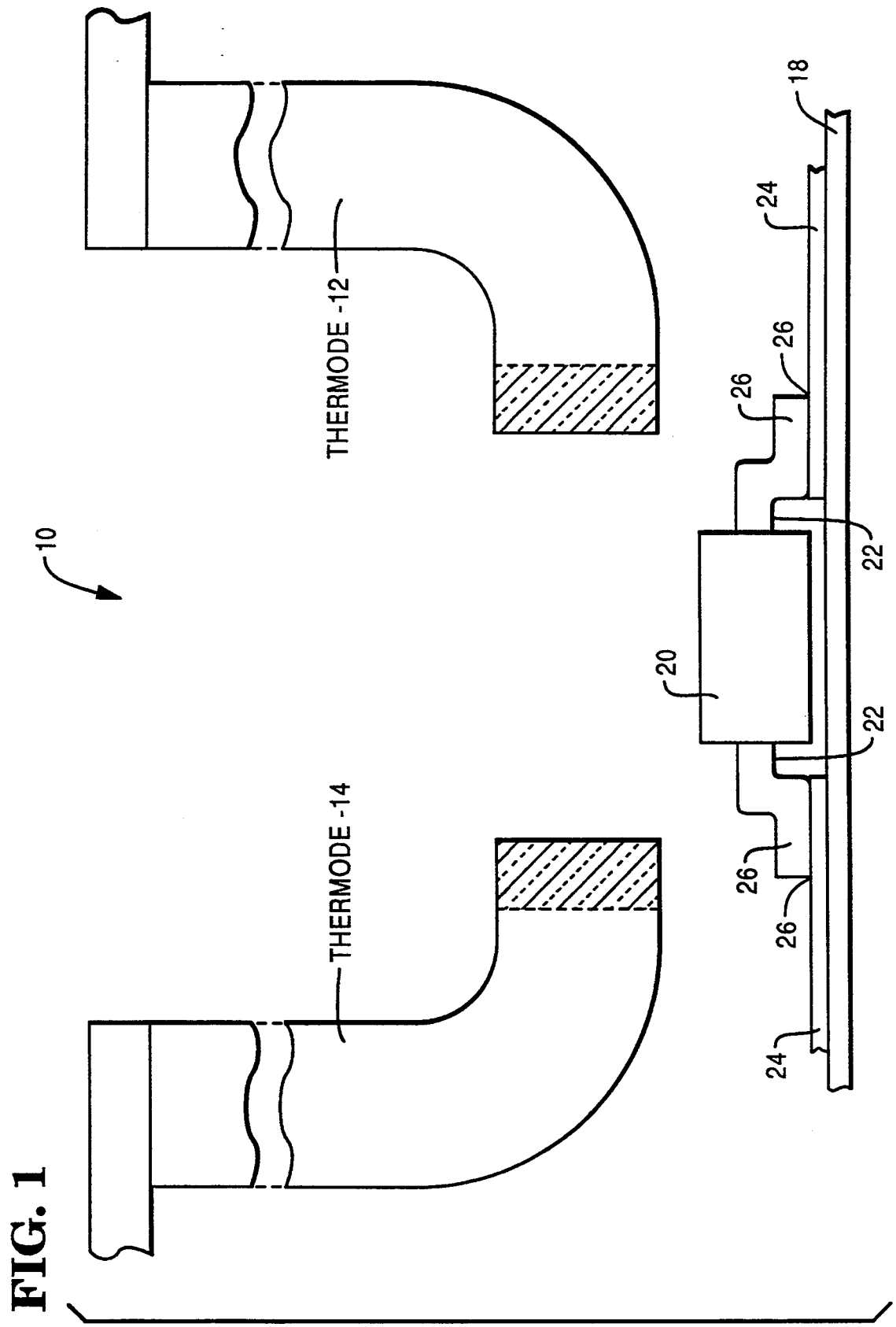
FIG. 1 is a front view of a hot bar apparatus having two thermodes for bonding external leads of a small outline integrated circuit to conductors in accordance with the invention.

Referring now to FIG. 1, a bonding apparatus 10 is shown. The bonding apparatus 10 is connected to larger machine, such as a Hot Bar Bonder by Universal Instruments or a similar device. Such a device has a carrier (not shown) to which the bonding apparatus 10 is attached. The bonding apparatus 10 has two opposing thermodes 12, 14. The two thermode example was selected for simplicity of description, but the invention is not limited to two thermodes, in fact an apparatus with four thermodes is contemplated for integrated circuits with external leads on four sides.

The location of the carrier and thermodes 12, 14 is controlled, for example by robotic control, in a horizontal plane above an electronic module 18 until it is over the integrated circuit 20 and the conductors 22, 24 that are attached to the module 18. Once the thermodes 12, 14 are located over the integrated circuit 20 and the integrated circuit's respective conductors 24 on the module 18, the thermodes 12, 14 are lowered until physical contact is made between the thermodes 12, 14 and the external leads 22 of the integrated circuit 20.

Typically a coat of a bonding material 26, such as tin/lead solder, is applied beforehand to the external leads 22 of the integrated circuit 20, the conductors 24, or both. To effect a bond, the thermodes 12, 14 after they are lowered onto the external leads 22 are heated such that the bonding material 26 melts and flows around and between the external leads 22 and the conductors 24. After the bonding material 26 has melted and allowed to flow, it is allowed to cool until it solidifies, in order to form bonds that are physically strong and electrically conductive. Bonds similar to the ones produced by the thermodes 12, 14 are well known in the art.

Figure 2:
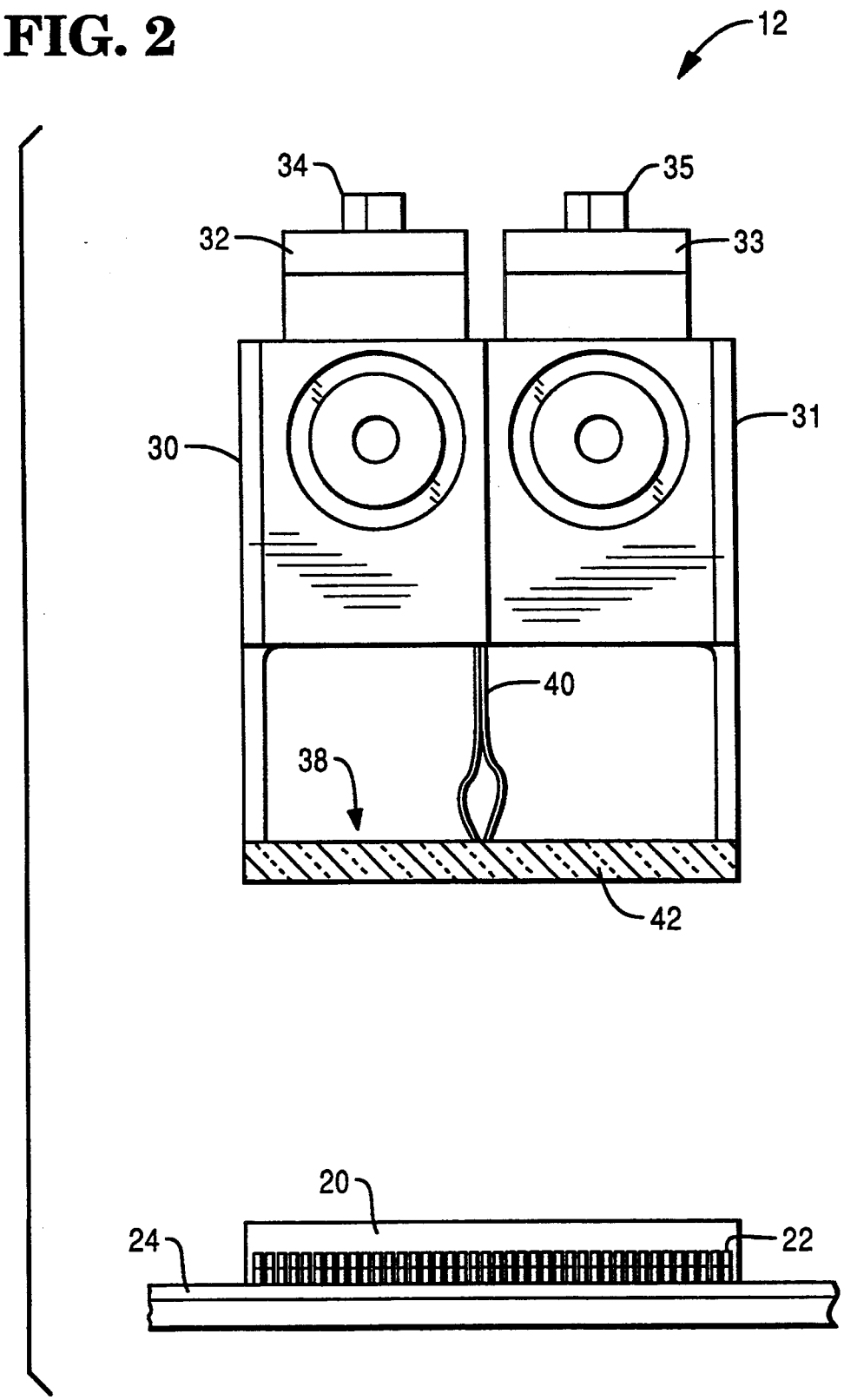
FIG. 2 is partially broken away side view of the hot bar apparatus and small outline integrated circuit shown tin FIG. 1, in accordance with the invention.

Referring now to FIG. 2, the bonding apparatus 10 will be described further. Since The bonding apparatus 10 has two thermodes 12, 14 that are substantially mirror images of each other, only the thermode 12 will be described. Those skilled in the art will understand the invention from the description of the thermode 12.

The thermode 12 has two mounting brackets 32, 33 that are insulated from each other to prevent electrical short circuits. Strut 30 is connected to and projects from bracket 32. Similarly, strut 31 is connected to and projects from bracket 33. Each of the brackets 32, 33 has an electrical connection point 34, 35. These connection points are for the connection of conductors (not shown) that carry heat producing electrical current. The struts 30, 31 and the brackets 32, 33 are made of materials that have good electrical conductances, such as a copper alloys, and also have good rigidities so that they keep their shape during repeated use.

The struts 30, 31 are connected at their lower ends to a hot bar 38, which is also of an electrically conductive material. The hot bar 38 is designed such that it heats up as an electrical current is passed through it. Since the hot bar 38 is also the portion of the thermode 12 that make physical contact with the integrated circuit conductors 24, it is important that the hot bar 38 retain its shape during use. For these reasons, the hot bar 38 is made of a refractory metal such as titanium.

To provide heat, electrical current is conducted through struts 30, 31, connection points 34, 35 and the hot bar 38. A thermocouple 40 is attached to the middle of the hot bar 38. The thermocouple 40 outputs an electrical signal that is a known function of the temperature of the bar. This signal is used to sense the temperature of the hot bar 38 so the heat producing electrical current through the hot bar 38 may be controlled to provide the desired temperature during each soldering operation. This temperature and time function is sometimes called a temperature profile.

Figure 3:
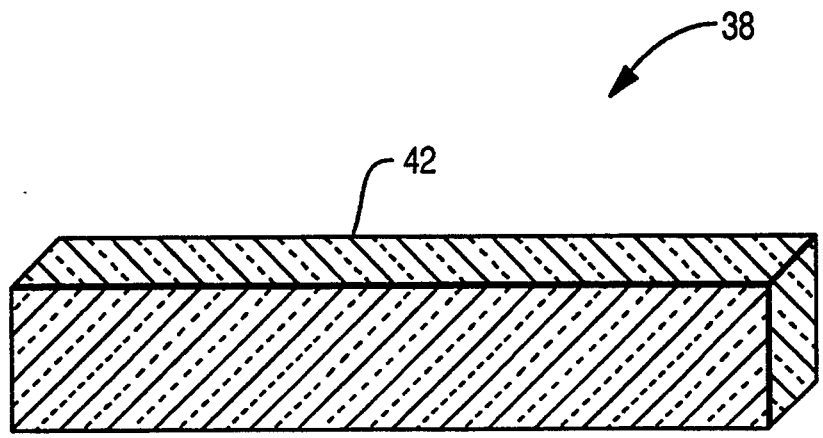
FIG. 3 is a perspective view of a hot bar with a coating of diamond or diamond-like material before it has been attached to a thermode in accordance with the invention.

Referring now to FIGS. 2 and 3, one embodiment of the invention will be described. FIG. 3 shows a hot bar 38 that has a diamond or diamond-like coating 42 on it. This diamond or diamond-like coating may be effected by a low pressure deposition process or a similar process. The coating can be deposited either as a single crystal coating or as a poly-crystalline coating.

The coating 42 may be deposited on the hot bar 38 with openings in the coating to allow for brazing of the hot bar 38 to the struts 30, 31, or the hot bar 38 may be fastened to the struts 30, 31 by brazing or similar unitary forming process and then the coating deposited on the hot bar 38. In either case, the temperature of the hot bar 38 can be increased during the depositing process in order to prestress the hot bar 38 by thermal expansion thereof. This prestressing prevents the coating from fracturing from thermal expansion of the hot bar 38 when the heat producing current is applied.

Figure 4:
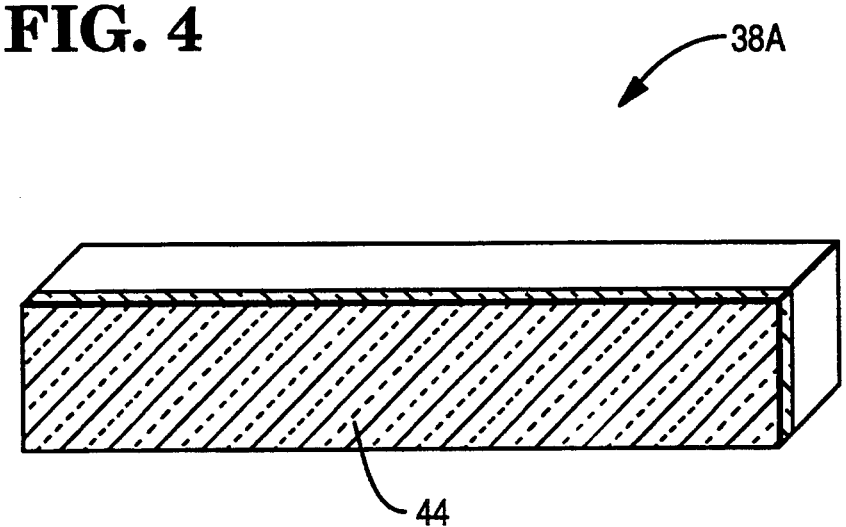
FIG. 4 is a perspective view of a hot bar with a layer of diamond or diamond-like material attached thereon before the hot bar has been attached to a thermode in accordance with the invention.

Referring now to FIGS. 2 and 4, a second embodiment of the invention will be described. FIG. 4 shows a hot bar 38A that is of similar material and has similar dimensions as the hot bar 38 shown in FIG. 3. The hot bar 38A has a layer 44 of diamond or diamond-like material attached to one side thereof. The layer 44 may be a slab off of a naturally occurring diamond, or it could be a slab off of a diamond or diamond-like crystal formed by a high temperature and high pressure manufacturing process. The layer 44 can be either single crystal type or poly-crystalline type.

The layer 44 is fastened to the hot bar 38A by brazing, or similar unitary forming process. The hot bar 38A is attached by brazing or some similar unitary forming operation to the struts 30, 31 either before or after the fastening of the layer 44 to the hot bar 38A. Since brazing and similar processes heat up the hot bar 38A and the layer 44, some prestressing by thermal expansion of the hot bar 38A and the layer 44 is involved in the manufacturing process of this embodiment of the invention.

Thus, it will now be understood that there has been disclosed a new and novel bonding apparatus which includes thermodes having diamond covered soldering surfaces. Although the present invention may be used for almost any soldering operation, it is very advantageous when used to solder external leads of surface mount components. While the invention has been particularly illustrated and described with reference to preferred embodiments thereof, it will be understood by those skilled in the art that various changes in form, details, and applications may be made therein. For example, the present invention could be practiced on soldering heads that solder components that have leads on one, three or four sides instead of two. It is accordingly intended that the appended claims shall cover all such changes in form, details and applications which do not depart from the true spirit and scope of the invention.

What is claimed as new and desired to be secured by Letters Patent of the United States is:

1. An apparatus for soldering each external lead of an integrated circuit to a respective conductor comprising:
   a first thermode for converting a first electrical current into heat to effect a first temperature thereof including first and second adjacent strut members having first and second electrical connectors at top ends of first and second strut member and having a hot bar made of a refractory metal connected at lower ends of the first and second strut members to form a first soldering end;
   a second thermode for converting a second electrical current into heat to effect a second temperature thereof including first and second adjacent strut members having first and second electrical connectors at top ends of the first and second strut members and having a hot bar made of the refractory metal connected at lower ends of the first and second strut members to form a first soldering end facing the first soldering end of the first thermode;
   a first temperature sensor attached to the middle of the hot bar of the first thermode for sensing said first temperature of said first thermode;
   a second temperature sensor attached to the middle of the hot bar of the second thermode for sensing said second temperature of said second thermode;
   controller connected to said first and second temperature sensors and said first and second thermodes to limit said first and second electrical currents to maintain said first and second temperatures at first and second predetermined levels and then to reduce them in accordance with a temperature profile;
   a first diamond coating covering a portion of said first thermode that provides a first durable layer that said heat is transferred through to solder bond a first external lead to its respective conductor; and
   a second diamond coating covering a portion of said second thermode that provides a second durable layer that said heat is transferred through to solder bond a second external lead to its respective conductor;
   said first and second diamond coatings being formed by a low pressure deposition process;
   said first and second diamond coatings being located in physical contact with the first and second exterior leads while the first and second temperatures are being maintained to melt solder between the first and second exterior leads and their respective conductors; and
   said first and second diamond coatings being located in physical contact with the first and second exterior leads while the first and second temperatures are being reduced to allow the solder to solidify and form bonds.

2. An apparatus for soldering each external lead of an integrated circuit as set forth in claim 1 wherein said first and second diamond coatings are of a single crystal type.

3. An apparatus for soldering each external lead of an integrated circuit as set forth in claim 1 wherein said first and second diamond coatings are of a poly-crystalline type.

* * * * *

UNITED STATES PATENT AND TRADEMARK OFFICE
CERTIFICATE OF CORRECTION

PATENT NO. : 5,359,170
DATED : October 25, 1994
INVENTOR(S) : Sy-Hwa Chen et al.

It is certified that error appears in the above-indentified patent and that said Letters Patent is hereby corrected as shown below:

Column 5, line 40, after "off" insert --the--.

Column 5, line 40, delete "member" and insert --members--.

Column 6, line 11, before "controller" insert --a--.

Signed and Sealed this

Twenty-sixth Day of September, 1995

Attest:

BRUCE LEHMAN

*Attesting Officer*   *Commissioner of Patents and Trademarks*